(12) United States Patent
Kim et al.

(10) Patent No.: US 7,990,799 B2
(45) Date of Patent: Aug. 2, 2011

(54) SEMICONDUCTOR MEMORY DEVICE THAT INCLUDES AN ADDRESS CODING METHOD FOR A MULTI-WORD LINE TEST

(75) Inventors: Hyun-Ki Kim, Suwon-si (KR); Whee-Jin Kwon, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 381 days.

(21) Appl. No.: 12/318,685

(22) Filed: Jan. 6, 2009

(65) Prior Publication Data
US 2009/0175105 A1   Jul. 9, 2009

(30) Foreign Application Priority Data
Jan. 7, 2008   (KR) .......................... 10-2008-001550

(51) Int. Cl.
*G11C 8/00*   (2006.01)
(52) U.S. Cl. ............ 365/230.06; 365/230.03; 365/233.1
(58) Field of Classification Search ............. 365/230.06, 365/230.03, 233.1
See application file for complete search history.

(56) References Cited

U.S. PATENT DOCUMENTS

| 5,867,440 | A | 2/1999 | Hidaka |
| 6,256,257 | B1 | 7/2001 | Park et al. |
| 7,180,816 | B2 * | 2/2007 | Park .......................... 365/230.03 |
| 2007/0047367 | A1 | 3/2007 | Kim et al. |

FOREIGN PATENT DOCUMENTS
KR   10-0535072   3/2006
* cited by examiner

*Primary Examiner* — Son T Dinh
*Assistant Examiner* — Nam T Nguyen
(74) *Attorney, Agent, or Firm* — Harness, Dickey & Pierce, P.L.C

(57) ABSTRACT

Example embodiments relate to a semiconductor memory device that includes an address coding method for a multi-word line test, for example, an address coding method to test a semiconductor memory device having a cell block row selection circuit. The semiconductor memory device may include a plurality of memory cell blocks, where each memory cell block may include memory cells coupled to a bit line. The method may include coding row addresses of the memory cell block by dividing one or more row addresses corresponding to cell blocks of the memory cell block to create sub-cell blocks and adding the sub-cell blocs into the main cell blocks to create a logical memory block, which enables word lines of the main cell blocks and sub-cell blocks at the same time.

17 Claims, 14 Drawing Sheets

FIG. 8 (CONVENTIONAL ART)

| | L0 ~ L15 | L16 ~ L31 | R0 ~ R15 | R16 ~ R31 |
|---|---|---|---|---|
| RA13 | 0 | 0 | 1 | 1 |
| RA12 | 0 | 1 | 0 | 1 |

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| RA11 | 0 | 0 | 0 | 0 | 0 | 0 | 0 | 0 | 1 | 1 | 1 | 1 | 1 | 1 | 1 | 1 |
| RA10 | 0 | 0 | 0 | 0 | 1 | 1 | 1 | 1 | 0 | 0 | 0 | 0 | 1 | 1 | 1 | 1 |
| RA9 | 0 | 0 | 1 | 1 | 0 | 0 | 1 | 1 | 0 | 0 | 1 | 1 | 0 | 0 | 1 | 1 |
| RA8 | 0 | 1 | 0 | 1 | 0 | 1 | 0 | 1 | 0 | 1 | 0 | 1 | 0 | 1 | 0 | 1 |

[ MWL2 ] → RA7 Don't Care
ENABLED EXAMPLE OF TWO WLs

[ MWL4 ] → RA7, 6 Don't Care

[ MWL8 ] → RA7, 6, 5 Don't Care

[ MWL16 ] → RA7, 6, 5, 4 Don't Care

FIG. 10(CONVENTIONAL ART)

| | L0 ~ L12 | L13 ~ L25 | R0 ~ R12 | R16 ~ R25 |
|---|---|---|---|---|
| RA13 | 0 | 0 | 1 | 1 |
| RA12 | 0 | 1 | 0 | 1 |

| | 0 | 1 | 2 | 3 | 4 | 5 | 6 | 7 | 8 | 9 | 10 | 11 | 12 |
|---|---|---|---|---|---|---|---|---|---|---|---|---|---|
| RA11 | 00000 | 00000 | 00000 | 00000 | 00000 | 00000 | 00111 | 11111 | 11111 | 11111 | 11111 | 11111 | 1111x |
| RA10 | 00000 | 00000 | 00000 | 01111 | 11111 | 11111 | 11000 | 00000 | 00000 | 00011 | 11111 | 11111 | 1111x |
| RA9  | 00000 | 00011 | 11111 | 10000 | 00001 | 11111 | 11000 | 00000 | 00011 | 11111 | 10000 | 11111 | 1111x |
| RA8  | 00001 | 11100 | 00111 | 10000 | 11110 | 00011 | 11000 | 01111 | 00001 | 11100 | 00111 | 00001 | 1111x |
| RA7  | 00110 | 01100 | 11001 | 10011 | 00110 | 01100 | 11001 | 10011 | 00110 | 00110 | 01100 | 11001 | 1001x |
| RA6  | 01010 | 10101 | 01010 | 10101 | 01010 | 10101 | 01010 | 10101 | 01010 | 10101 | 01010 | 10101 | 0101x |

[ MWL4 ] → RA5, 4 Don't Care
ENABLED EXAMPLE OF FOUR WLs

[ MWL2 ] → RA5 Don't Care
ENABLED EXAMPLE OF TWO WLs

FIG. 12

| | L0 ~ L12 | L13 ~ L25 | R0 ~ R12 | R16 ~ R25 |
|---|---|---|---|---|
| RA13 | 0 | 0 | 1 | 1 |
| RA12 | 0 | 1 | 0 | 1 |

Physical 13 Block

Logical 16 Block

| | 0 | 1 | 2 | 3 | 4 | 5 | 6 | 7 | 8 | 9 | 10 | 11 | 12 |
| --- | --- | --- | --- | --- | --- | --- | --- | --- | --- | --- | --- | --- | --- |
| 22— | 0 | 1 | 2 | 3 | 4 | 5 | 6 | 7 | 8 | 9 | 10 | 11 | 12 |
| 20— | 13 | 13 | 13 | | P4K 14 | 14 | 14 | | | 15 | 15 | 15 | |
| 21— 23— | | | | | | | | | | | | | |

| | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
|---|---|---|---|---|---|---|---|---|---|---|---|---|---|---|---|---|---|---|---|---|---|---|
| | 2 | 13 | 3 | | 4 | 14 | 6 | 14 | | 7 | | 8 | 14 | 9 | 15 | 10 | 15 | 11 | 15 | 12 | 15 |

| | 0 | 1 | 2 | 3 | 4 | 5 | 6 | 7 | 8 | 9 | 10 | 11 | 12 |
|---|---|---|---|---|---|---|---|---|---|---|---|---|---|
| RA11 | 0 | 0 | 0 | 0 | 0 | 0 | 0 | 1 | 1 | 1 | 1 | 1 | 1 |
| RA10 | 0 | 0 | 0 | 1 | 1 | 1 | 1 | 0 | 0 | 0 | 0 | 1 | 1 |
| RA9 | 0 | 0 | 1 | 0 | 1 | 0 | 1 | 0 | 1 | 0 | 1 | 0 | 1 |
| RA8 | 0 | 1 | 0 | 1 | 0 | 1 | 0 | 1 | 0 | 1 | 0 | 1 | 0 |

| | 13 | 14 | 15 |
|---|---|---|---|
| RA11 | 1 | 1 | 1 |
| RA10 | 1 | 1 | 1 |
| RA9 | 0 | 1 | 1 |

| | 50 | 51 | 52 | 53 | 60 | 61 | 62 | 63 | 64 | 70 | 71 | 72 | 73 |
|---|---|---|---|---|---|---|---|---|---|---|---|---|---|
| RA8 | 00 | 00 | 11 | 11 | 0 | 00 | 0 | 11 | 1 | 00 | 00 | 11 | 11 |
| RA7 | 00 | 00 | 00 | 11 | 0 | 01 | 01 | 01 | 1 | 00 | 11 | 11 | 11 |
| RA6 | 00 | 11 | 00 | 11 | 0 | 10 | 10 | 10 | 1 | 11 | 00 | 00 | 11 |
| RA5 | 01 | 01 | 01 | 01 | | 10 | 10 | 10 | | 01 | 01 | 01 | 01 |

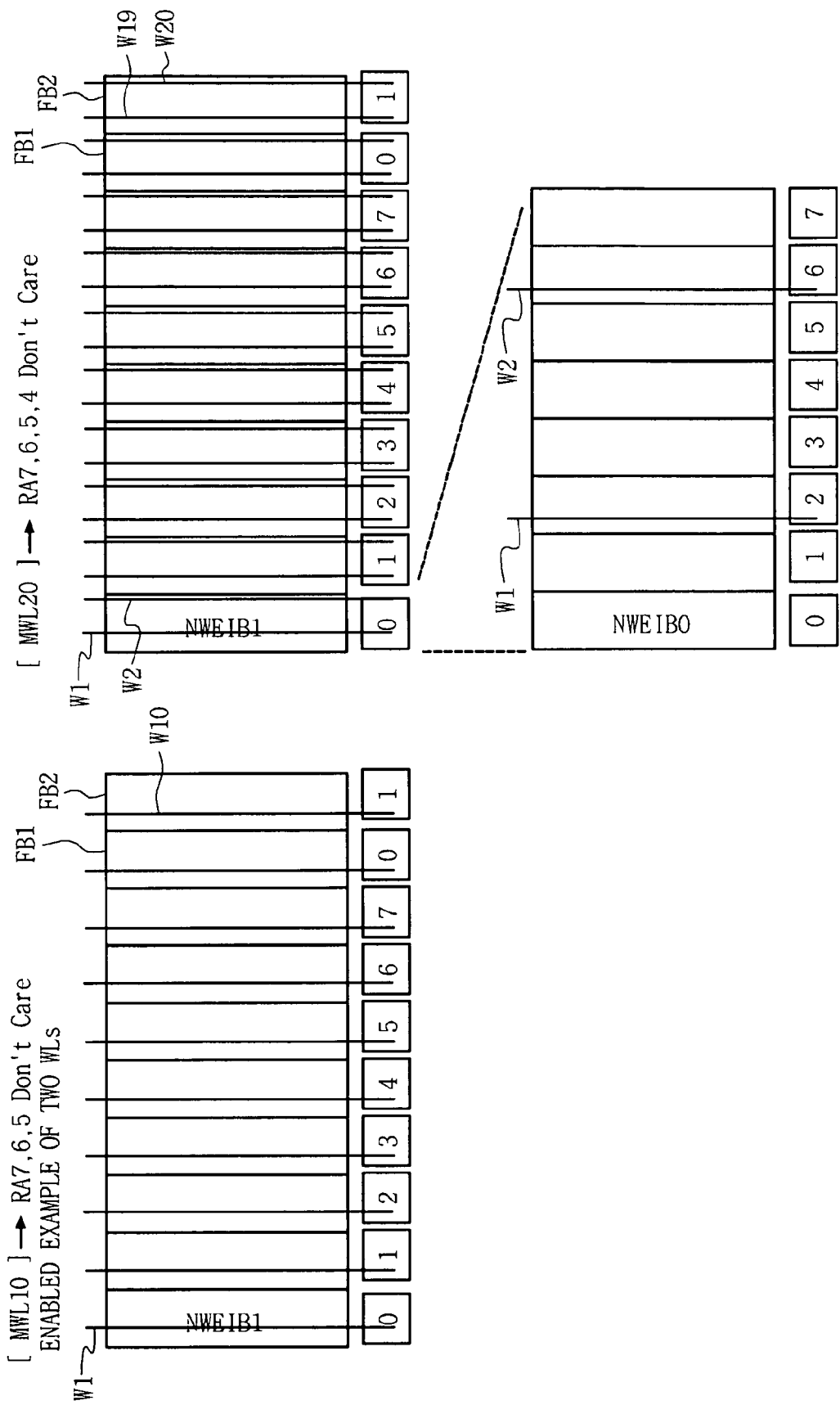

though the cell block coding of FIG. 8. Referring to FIG. 9,

SEMICONDUCTOR MEMORY DEVICE THAT INCLUDES AN ADDRESS CODING METHOD FOR A MULTI-WORD LINE TEST

CROSS-REFERENCE TO RELATED APPLICATIONS

This U.S. non-provisional patent application claims the benefit of Korean Patent Application 10-2008-0001550, filed on Jan. 7, 2008, in the Korean Intellectual Property Office, the entire contents of which are incorporated herein by reference.

BACKGROUND

1. Field

Example embodiments relate to a semiconductor memory device that includes an address coding method for a multi-word line test, for example, an address coding method to test a semiconductor memory device having a cell block row selection circuit.

2. Description of the Related Art

Conventionally, a data storage space of semiconductor memory devices may be a memory cell array such as a Dynamic Random Access Memory (DRAM), Static Random Access Memory (SRAM), and Parameter Random Access Memory (PRAM), for example. The memory cell array may include a plurality of memory cells coupled to intersections of word lines and bit lines.

An access operation to one of the plurality of memory cells may be performed by enabling a specific word line through a row address and by enabling a specific bit line through a column address. The access operation may include a write operation and a read operation, for example. The write operation may write data to a selected memory cell, and the read operation may read data from a selected memory cell. In a normal operation of a conventional semiconductor memory device, the word lines may be enabled one by one. However, in order to test semiconductor memory devices in mass production, a testing operation may require that the word lines and bit lines be enabled at the same time to reduce a testing time. A multi-word line test method for enabling a plurality of word lines at the same time during a testing operation may be referred to as an Address Don't Care scheme ("ADC scheme"). The ADC scheme may be a type of row address coding.

Generally, a number of memory cells coupled to a bit line may be $2^n$, where n is an integer greater or equal to two. For example, a number of memory cells may be 256Cell/BL per memory cell block, for example. However, if the number of memory cells coupled to a bit line is not $2^n$, inefficiency in the testing operating may exist when the ADC scheme is used. A 320Cell/BL or 416Cell/BL memory cell block may be an example of when the number of memory cells coupled to the bit line is not $2^n$. When a specific address becomes "Don't Care" to test the 320Cell/BL or 416Cell/BL memory cell block, word lines corresponding to the specific address may be selected at the same time. Some of the selected word lines may be not enabled due to an insufficient capacity of an internal boosted voltage power of the semiconductor memory device.

FIG. 8 illustrates a conventional row address coding method for the 256Cell/BL memory cell block. Referring to FIG. 8, the memory cell block may include 64 cell blocks. The 64 cell blocks may be divided into four parts, where each part includes 16 cell blocks. The four parts may be L0-L15, L16-L31, R0-15 and R16-R31. The 256Cell/BL memory cell block may include row addresses RA0~RA13, and a total number of row addresses may be 16K, where K is $2^n$. In this particular example, n may be 10. The row addresses RA8~RA13 may be referred to as higher-level row addresses, where each row address RA8~RA13 may determine the coding for the 64 cell blocks. Three middle-level row addresses RA5~RA7 may determine the coding for eight word line enable signals NWEIB1 within each cell block.

Furthermore, row addresses RA2~RA4 may determine a coding of eight word line enable signals NWEIB0. Row address RA0 and RA1 may determine the coding for four word lines. That is, one of the word lines of 16K-number is selected by the 14-bit row address coding and activated.

FIG. 9 illustrates a conventional multi-word line test through the cell block coding of FIG. 8. Referring to FIG. 9, multi-word line 2 (MWL2) may indicate that two word lines may be enabled within one cell block in the multi-word line test when row address RA7 becomes "Don't care." In other words, one word line per four word line enable signals NWEIB1 may be enabled. Multi-word line 4 (MWL4) may indicate that four word lines may be enabled within one cell block in the multi-word line test when row addresses RA7 and RA6 become "Don't care." Multi-word line 8 (MWL8) may indicate that eight word lines may be enabled within one cell block in the multi-word line test when row addresses RA7, RA6 and RA5 become "Don't care." Multi-word line 16 (MWL16) may indicate that 16 word lines may be enabled within one cell block in the multi-word line test when RA7, RA6, RA5 and RA4 become "Don't care."

As shown in FIG. 9, as the number of row addresses become "Don't care" increases by one, an enabled interval of word lines may be reduced by half, and the number of enabled word lines may double. When using an address of RA8 or more, the enabled word lines may exceed a range of the memory cell block. In addition, when using an address of RA3 or below, an interval between word lines may become too narrow. As a result, the conventional address coding scheme for a 256Cell/BL memory cell block may be difficult to apply. In addition, in the 256Cell/BL memory cell block, row addresses capable of becoming "Don't Care" may be limited to four row addresses RA4~RA7, and the application of the multi-word line test may be only valid from the multi-word line 2 (MWL2) to the multi-word line 16 (MWL16).

FIG. 10 illustrates a conventional row address coding method for the 320Cell/BL memory cell block. For the 320Cell/BL memory cell block, row addresses RA6~RA13 may be used for the coding of 52 cell blocks. The only addresses capable of becoming "Don't Care" in the multi-word line test for the 320Cell/BL memory cell block may be RA4 and RA5.

FIG. 11 illustrates a conventional multi-word line test through the cell block coding of FIG. 10. For performing the multi-word line test through the cell block coding of FIG. 10, only multi-word line 2 (MWL2) and multi-word line 4 (MWL4) may be applied. As a result, because only a total of four word lines may be enabled, a test time may increase as compared with the 256Cell/BL coding described above.

SUMMARY

Example embodiments provide an address coding method to test a semiconductor memory device. The semiconductor memory device may include a plurality of memory cell blocks, where each memory cell block may include memory cells coupled to a bit line. The method may include coding row addresses of the memory cell block by dividing one or more row addresses corresponding to cell blocks of the memory cell block to create sub-cell blocks and adding the sub-cell blocs into the main cell blocks to create a logical memory block, which enables word lines of the main cell blocks and sub-cell blocks at the same time.

According to example embodiments, a number of the memory cells coupled to the bit line may not be 2n, where n is an integer greater or equal to two. In addition, the number of memory cells coupled to the bit line may be 320 or 416.

The number of cell blocks may be 52 and the number of cell blocks may be divided into four memory cell block groups, where each memory cell block group may include 13 cell blocks. A number of cell blocks of the logical memory block may be greater than the number of cell blocks within each memory cell block group.

According to example embodiments, a semiconductor memory device may include a cell block row selection circuit for enabling word lines of a memory cell block in a multi-word line test. The memory cell block may include main cell blocks and sub-cell blocks. The cell block row selection circuit may include a signaling gating part, a first word line enable signal generator, and a second word line enable signal generator. The signaling gating part may be configured to receive a main block selection signal, a sub-block selection signal, and a multi-word line test signal and generate sub-path signals. The first word line enable signal generator may be configured to generate word line enable signals to enable word lines for the main cell blocks. The second word line enable signal generator may be configured to generate word line enable signals to enable word lines for the sub-cell blocks. The main cell blocks and the sub-cell blocks may be enabled at the same time by coding row addresses of the memory cell block by dividing one or more row addresses corresponding to cell blocks of the memory cell block to create the sub-cell blocks and adding the sub-cell blocks into the main cell blocks to create a logical memory block.

The main cell blocks and the sub-cell blocks may be enabled at the same time in response to the main block selection signal, the sub-block selection signal, and the multi-word line test signal. A word line of the sub-cell blocks may be enabled through a linking to the main block selection signal. Multi-word line test information and block coding may be added into the sub-path signals.

According to example embodiments, when a row address of the main cell blocks is swept once in the multi-word line test, a word-line corresponding to the sub-blocks may be enabled without specifically applying an address of the sub-block. The first and second word line enable signal generators may include a plurality of drivers.

BRIEF DESCRIPTION OF THE DRAWINGS

The above and other features and advantages will become more apparent by describing in detail example embodiments thereof with reference to the attached drawings in which:

FIG. 8 illustrates a conventional row address coding method for the 256Cell/BL memory cell block;

FIG. 10 illustrates a conventional row address coding method for the 320Cell/BL memory cell block;

FIG. 12 illustrates a coding method for a 320Cell/BL memory cell block according to example embodiments; and FIGS. 13 and 14 illustrate a MWL test through the cell block coding of FIG. 12 according to example embodiments.

DETAILED DESCRIPTION OF THE EMBODIMENTS

Figure 1:
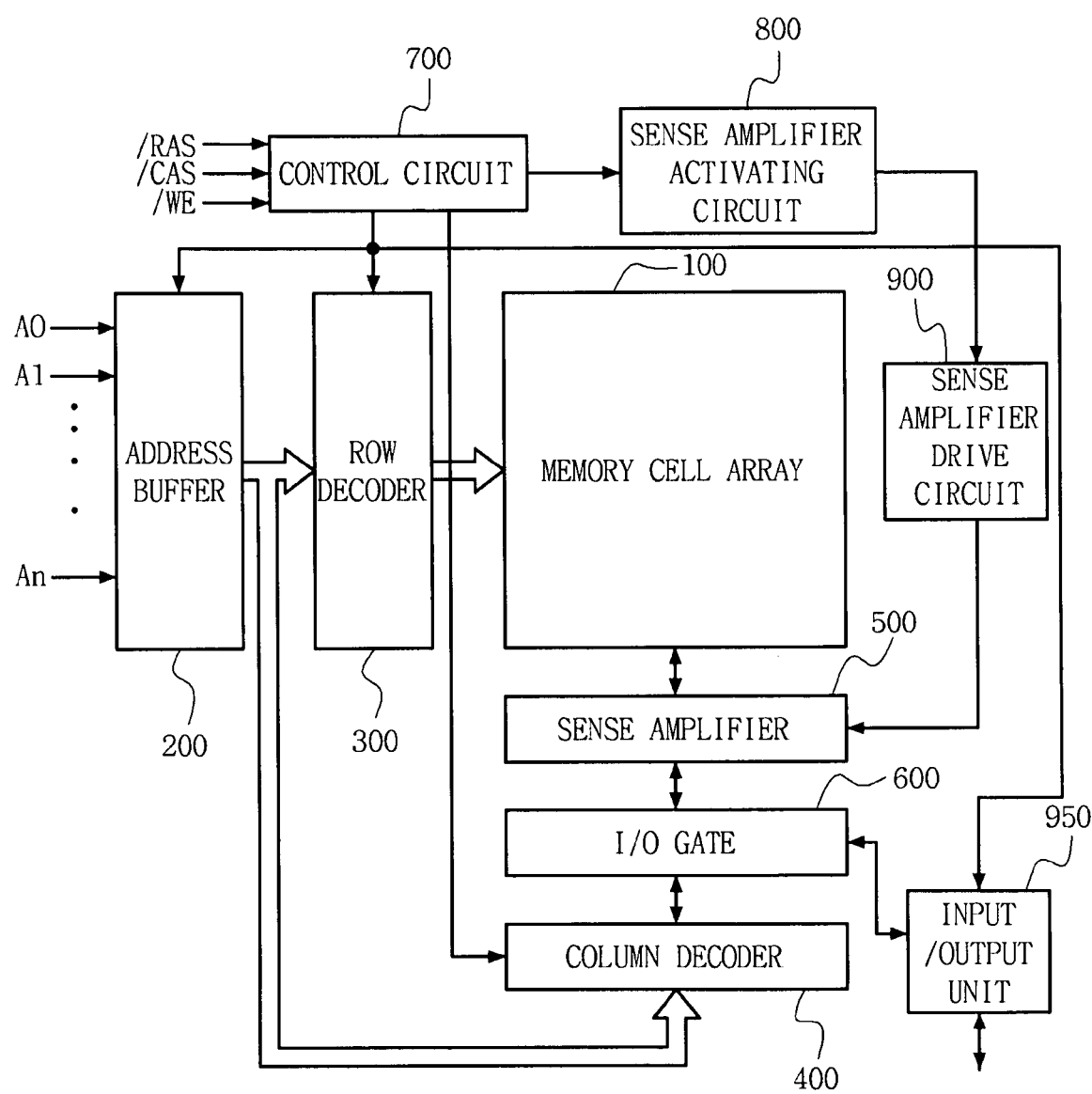
FIG. 1 illustrates a circuit block diagram of a semiconductor memory device according to example embodiments.

Example embodiments will now be described more fully with reference to the accompanying drawings. In the drawings, the thicknesses of layers and regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 illustrates a circuit block diagram of a semiconductor memory device according to example embodiments. The semiconductor memory device of FIG. 1 may include a memory cell array 100, an address buffer 200, a row decoder 300, a column decoder 400, an I/O gate 600, a sense amplifier 500, a control circuit 700, a sense amplifier activating circuit 800, a sense amplifier drive circuit 900, and an input/output unit 950. FIG. 1 is similar to FIG. 1 of U.S. Pat. No. 5,867,440, and therefore the function and operation of the respective blocks may be referred to in U.S. Pat. No. 5,867,440, which is incorporated by reference.

Figure 2:
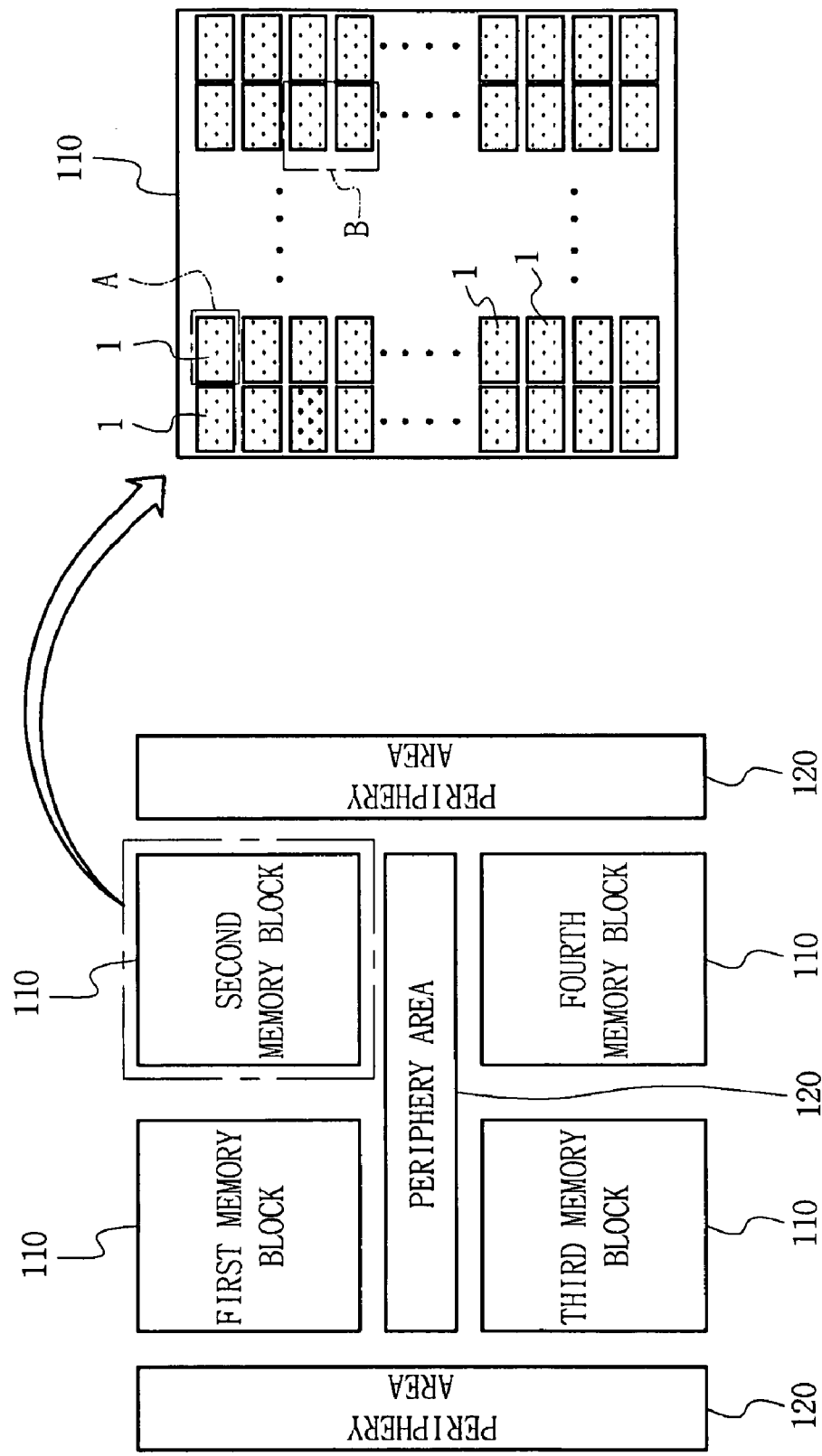
FIG. 2 illustrates a layout of a plurality of memory cell blocks according to example embodiments.

FIG. 2 illustrates a layout of a plurality of memory cell blocks 110 according to example embodiments. Referring to FIG. 2, the layout area may include a plurality of memory cell blocks 110 and a plurality of periphery areas 120. Each memory cell block 110 may include a plurality of sub-array blocks 1. Each sub-array block may include a plurality of memory cells MC arranged along a row and column direction as illustrated in FIG. 3.

Figure 3:
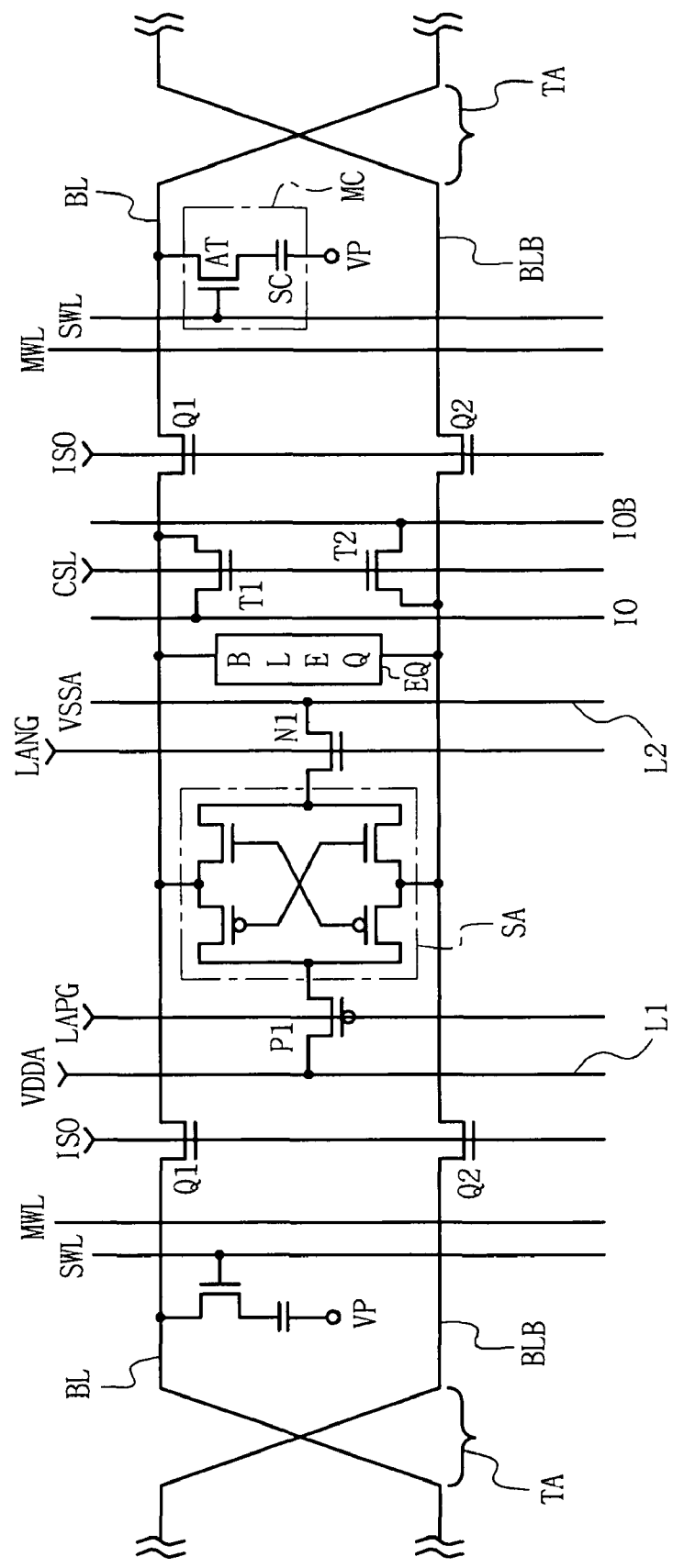
FIG. 3 illustrates memory cells MC and the connection between the memory cells MC within the sub-array block 1 of FIG. 2 according to example embodiments.

FIG. 3 illustrates memory cells MC and the connection between the memory cells MC within the sub-array block 1 of FIG. 2 according to example embodiments. The memory cell MC may include an access transistor AT and at least one storage capacitor SC. A gate terminal of the access transistor AT may be coupled to a sub-word line SWL, and a drain terminal of the access transistor AT may be coupled to a bit line BL. Although not shown in FIG. 3, the sub-word line SWL may be coupled to a main word line MWL. Referring to FIG. 3, various signal lines ISO, LAPG, LANG, CSL, IO and IOB may be received and applied either during a write operation to store data to the memory cell MC or a read operation to read data from the memory cell MC.

Referring to FIG. 3, an array power voltage VDDA may be provided to a source terminal of PMOS transistor P1 to drive a sense amplifier SA through a corresponding power supply line L1. An array ground voltage VSSA may be provided to a source terminal of NMOS transistor N1 to drive the sense amplifier SA through a corresponding power supply line L2. A twist area TA may include a bit line pair (BL, BLB) that may be arranged in a mutually intersected bit line structure for a coupling of parasitic capacitance.

Figure 4:
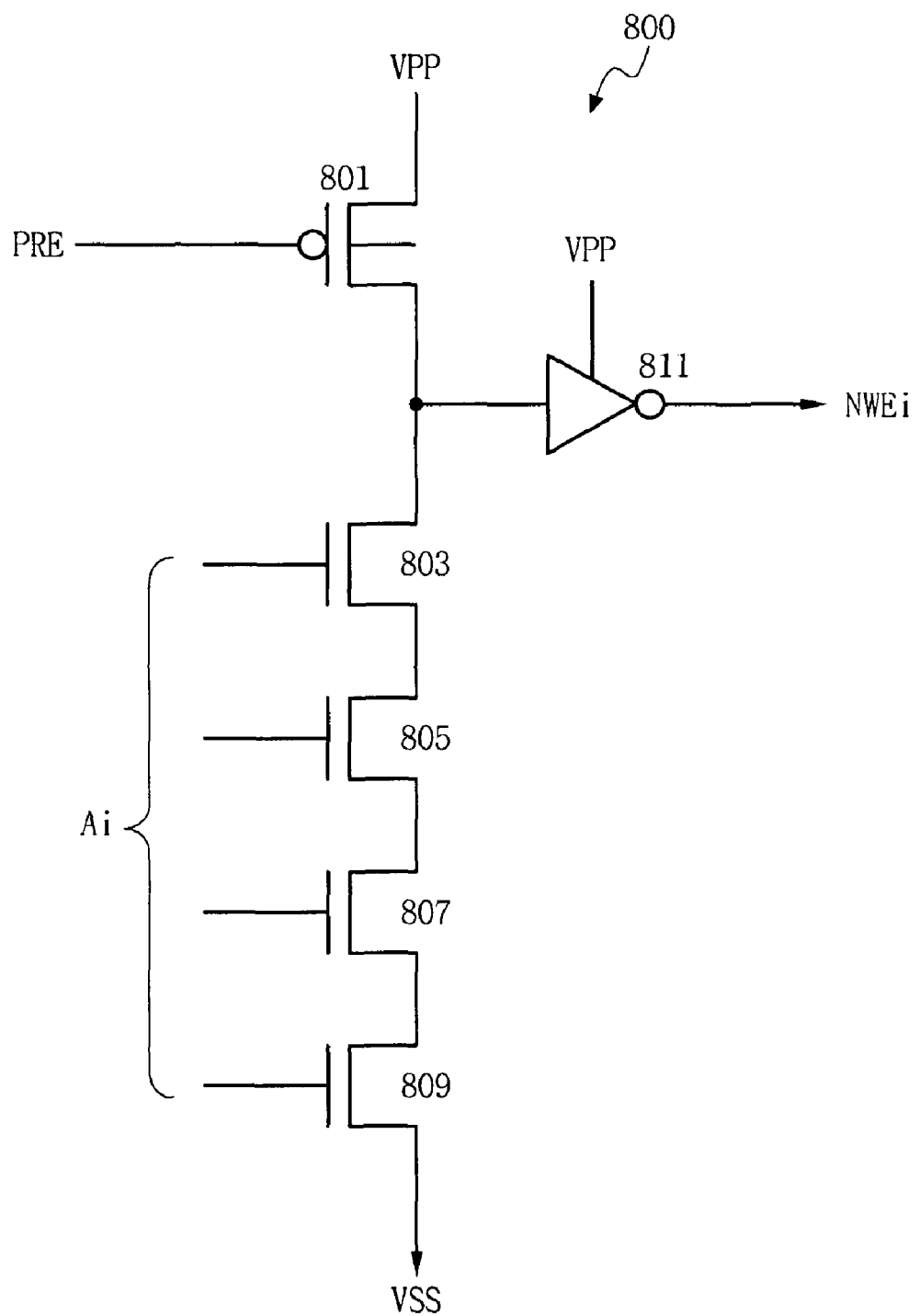
FIG. 4 illustrates a circuit diagram of a word line enable signal driver according to example embodiments.

FIG. 4 illustrates a circuit diagram of a word line enable signal driver 800 according to example embodiments. The word line enable signal driver 800 may generate a word line enable signal NWEi in response to an address signal Ai. The word line enable signal NWEi may be provided to a sub-word line driver illustrated in FIG. 5.

The word line enable signal driver 800 may include a PMOS transistor 801, a plurality of NMOS transistors 803 to 809, and an inverter 811. The PMOS transistor may have a gate terminal coupled to a precharge control signal PRE, a drain terminal coupled to an internal boosted power voltage VDD, and a source terminal coupled in series with the plurality of NMOS transistors 803 to 809. Each of the plurality of NMOS transistors 803 to 809 may have a gate terminal coupled with the address signal Ai. The plurality of NMOS transistors may be coupled in series between the PMOS transistor 801 and a ground voltage VSS. The inverter 811 may be coupled to the source terminal of the PMOS transistor 801.

When the precharge control signal PRE is inactive, the PMOS transistor 801 may be activated, and the word line enable signal driver 800 may be precharged to the internal boosted power voltage VPP. As a result, the source terminal of PMOS transistor 801 may have the internal boosted power voltage (VPP) level, and the word line enable signal NWEi may have a ground voltage or negative voltage level.

When the address signal Ai and the precharge control signal PRE become a logic high level, the plurality of NMOS transistors 803 to 809 may be activated, and the PMOS transistor 801 may be deactivated. As a result, the source terminal of the PMOS transistor 801 may become a ground voltage level, and the word line enable signal NWEi outputted from the inverter 811 may be maintained at the internal boosted power voltage level VPP.

Figure 5:
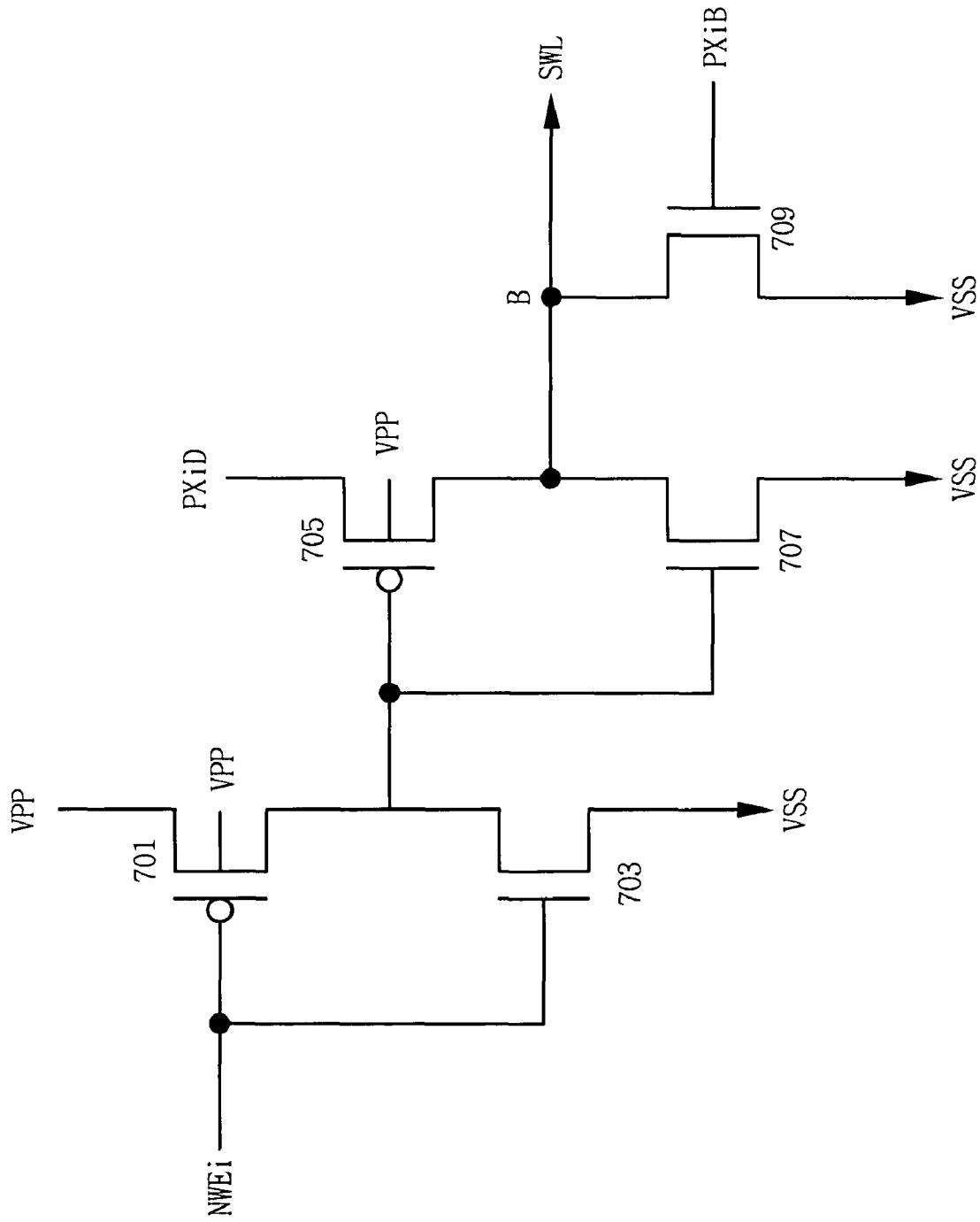
FIG. 5 is a circuit diagram illustrating a sub-word line driver according to example embodiments.

FIG. 5 is a circuit diagram illustrating a sub-word line driver according to example embodiments. The sub-word line driver may be a CMOS type sub-word line driver. Referring to FIG. 5, the sub-word line driver may receive the word line enable signal NWEi from the word line enable signal driver of FIG. 4, a sub-word line driver drive signal PXiD, and an inverse sub-word line driver drive signal PXiB. The sub-word line driver may generate a corresponding sub-word line SWL. The sub-word line driver may include a first PMOS transistor 701, a first NMOS transistor 703, a second PMOS transistor 705, a second NMOS transistor 707, and a third NMOS transistor 709.

In the first PMOS transistor 701, a gate terminal may be coupled to the word line enable signal NWEi, and a drain terminal may be coupled to the internal boosted power voltage VPP.

In the first NMOS transistor 703, a gate terminal may be coupled to the word line enable signal NWEi, and a drain terminal may be coupled to the source terminal of the first PMOS transistor 701, and a source terminal may be coupled to a ground voltage VSS.

In the second PMOS transistor 705, a gate terminal may be coupled to the source terminal of the first PMOS transistor 701, and a drain terminal may be coupled to the sub-word line driver drive signal PXiD.

In a second NMOS transistor 707, a gate terminal may be coupled to the source terminal of the first PMOS transistor 701, and a drain terminal may be coupled to the source terminal of the second PMOS transistor 705, and a source terminal may be coupled to the ground voltage VSS.

In a third NMOS transistor 709, a gate terminal may be coupled to the inverse sub-word line driver drive signal PXiB, and a drain terminal may be coupled to the source terminal of the second PMOS transistor 705, and a source terminal may be coupled to the ground voltage VSS.

A common connection contact B between the source terminal of second PMOS transistor 705, the drain terminal of second NMOS transistor 707 and the drain terminal of the third NMOS transistor 709 may be coupled to the sub-word line SWL.

The first PMOS transistor 701 and the first NMOS transistor 703 may be referred to as an inverter, where the first PMOS transistor 701 and the first NMOS transistor 703 may invert the word line enable signal NWEi, and then may output the inverted signal to a gate node of the second PMOS transistor 705 and the second NMOS transistor 707. When the word line enable signal NWEi has a logic low level, a negative voltage level or the ground voltage VSS may be applied to the gate terminal of the first PMOS transistor 701 and the first NMOS transistor 703. As a result, the first PMOS transistor 701 may be activated and the first NMOS transistor 703 may be deactivated. Thus, the internal boosted power voltage VPP inputted to the drain terminal of the first PMOS transistor 701 may be coupled to the gate terminals of the second transistor 705 and the second NMOS transistor 707. As the internal boosted power voltage VPP is applied, the second PMOS transistor 705 may be deactivated, and the second NMOS transistor 707 may be activated. As a result, the ground voltage VSS and the sub-word line SWL may be coupled to each other, the sub-word line driver may become inactive, the sub-word line SWL may maintain a logic low level through the ground voltage VSS, and the memory cell coupled to the sub-word line SWL may not be selected.

When the word line enable signal NWEi has a logic high level, the internal boosted power voltage level VPP may be applied to the gate terminals of the first PMOS transistor 701 and the first NMOS transistor 703. The first PMOS transistor 701 may be deactivated, and the first NMOS transistor 703 may be activated. Thus, the ground voltage VSS coupled with the source terminal of the first NMOS transistor 703 may be coupled to the gate terminals of the second PMOS transistor 705 and the second NMOS transistor 707. As the ground voltage VSS is applied, the second PMOS transistor 705 may be activated, and the second NMOS transistor 707 may be deactivated. Then, the sub-word line driver drive signal PXiD may have a logic high level, and the inverse sub-word line driver drive signal PXiB may have a logic low level. Then, the third NMOS transistor 709 also may maintain a deactivated state. As a result, the sub-word line driver drive signal PXiD of the logic high level may be coupled to sub-word line SWL, the sub-word line driver 700 may become active, the sub-word line SWL may maintain a logic high level, and the memory cell coupled to the sub-word line SWL may be selected. Thus, data of the memory cell may be output to bit line BL.

Figure 6:
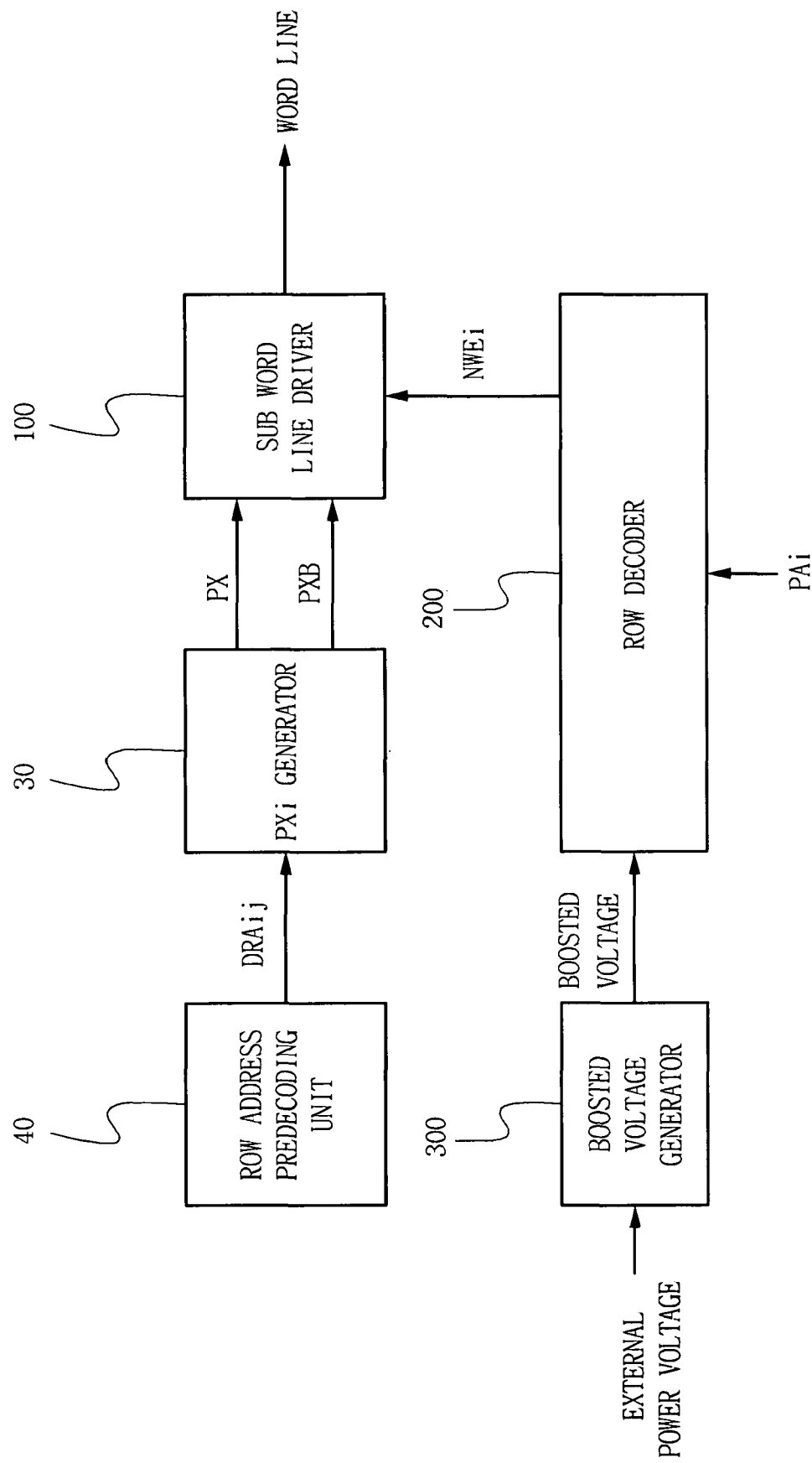
FIG. 6 illustrates a system for driving a sub-word line driver according to example embodiments.

FIG. 6 illustrates a system for driving a sub-word line driver according to example embodiments. The system for driving a sub-word line driver may include a row address predecoding unit 40, sub-word line driver drive signal generator 30, sub-word line driver 100, a boosted voltage generator 300, and a row decoder 200. The boosted voltage generator 300 may receive an external power voltage and boost the external power voltage to a boosted voltage to be provided to the row decoder 200. The row decoder 200 may receive a signal PAi, and generate the word line enable signal NWEi to be provided to the sub-word line driver 100. The row address predecoding unit 40 may generate a signal DRAij to be provided to the sub-word line driver drive signal generator 30. The sub-word line driver drive signal generator 30 may generate sub-word line driver drive signals PX, PXB.

The sub-word line driver 100 may receive the word line enable signal NWEi from the row decoder 200 and receive the sub-word line driver drive signals PX, PXB from the PXi generator 30. The sub-work line driver 100 may enable the sub-word line SLW.

Figure 7:
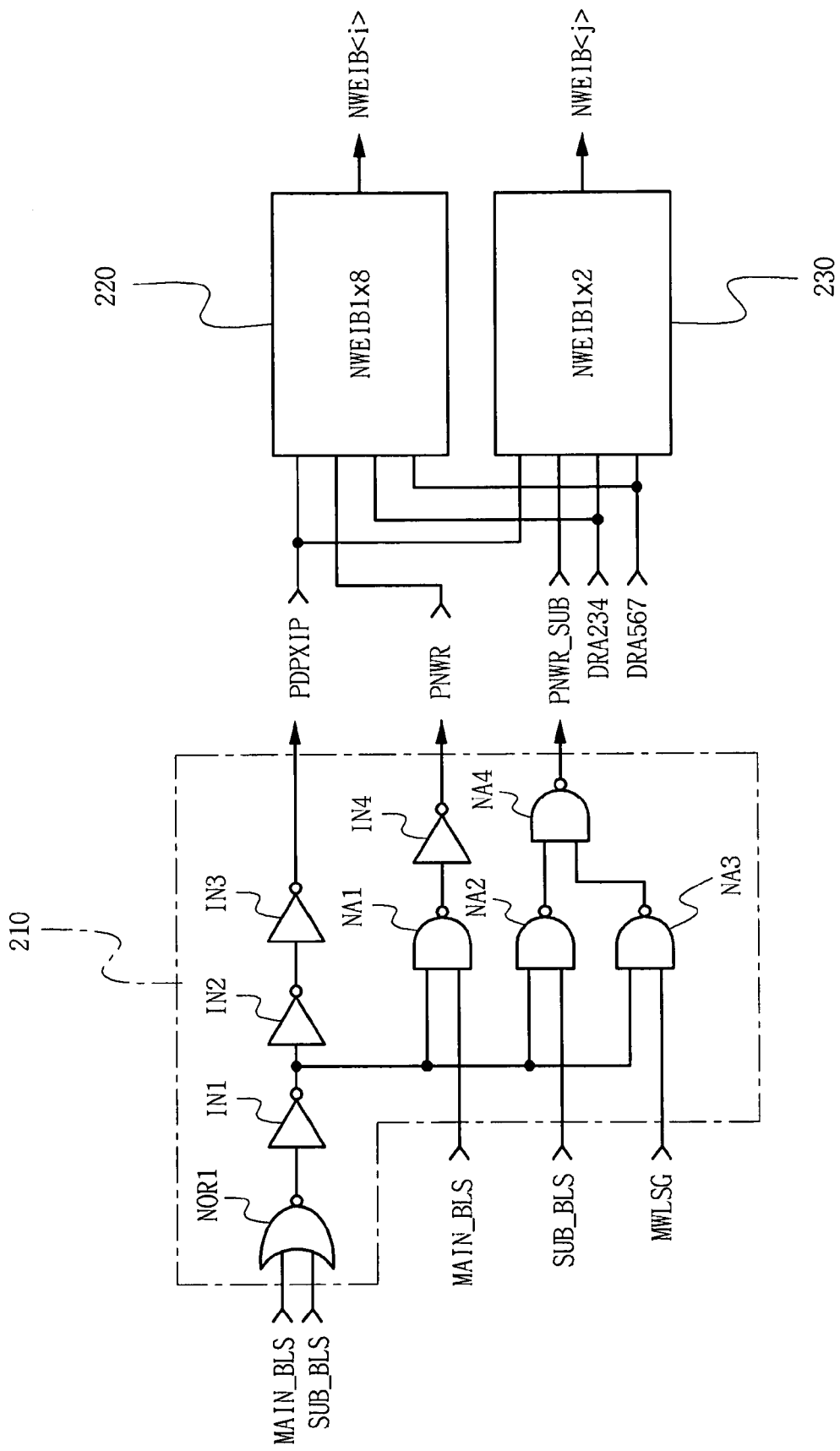
FIG. 7 is a circuit diagram illustrating a cell block row selection circuit within the row decoder of FIG. 2 according to example embodiments.
Figure 9:
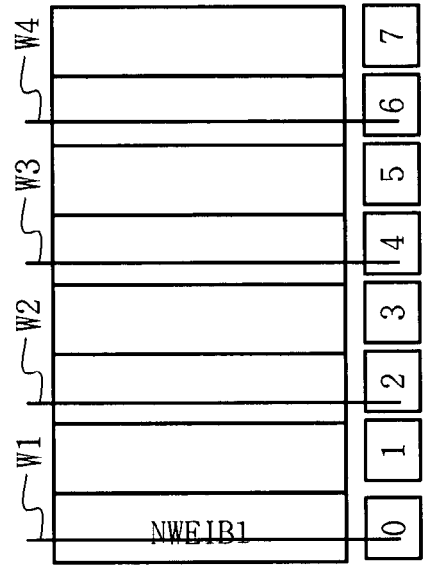
FIG. 9 illustrates a conventional multi-word line test through the cell block coding of FIG. 8.
Figure 9:
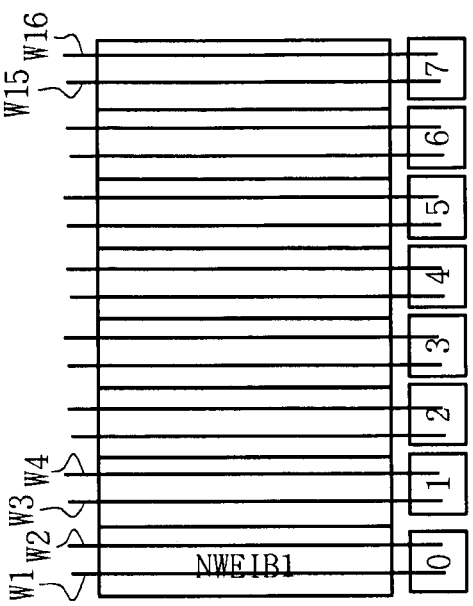
Figure 9:
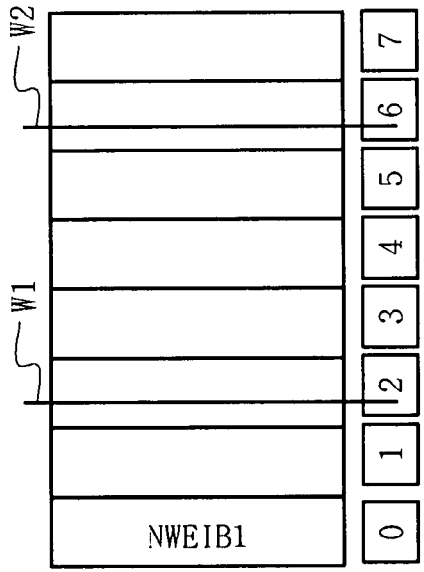
Figure 9:
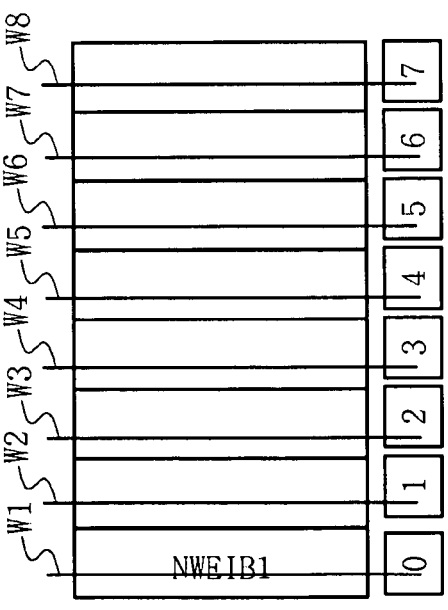
Figure 11:
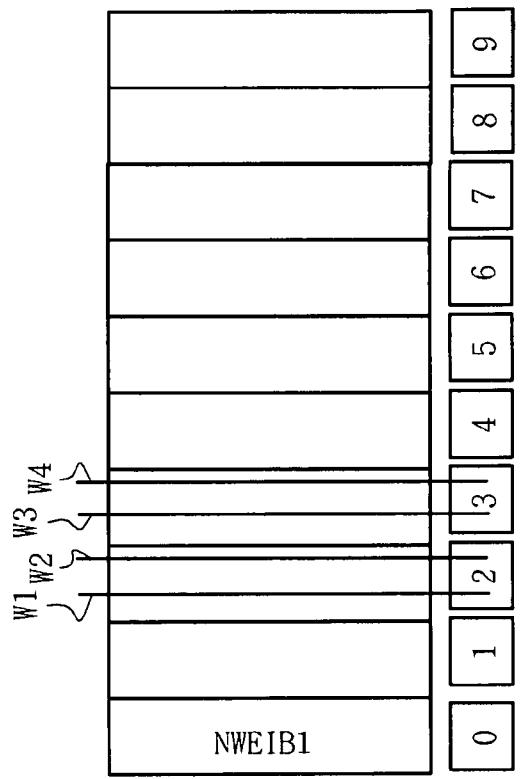
FIG. 11 illustrates a conventional multi-word line test through the cell block coding of FIG. 10.
Figure 11:
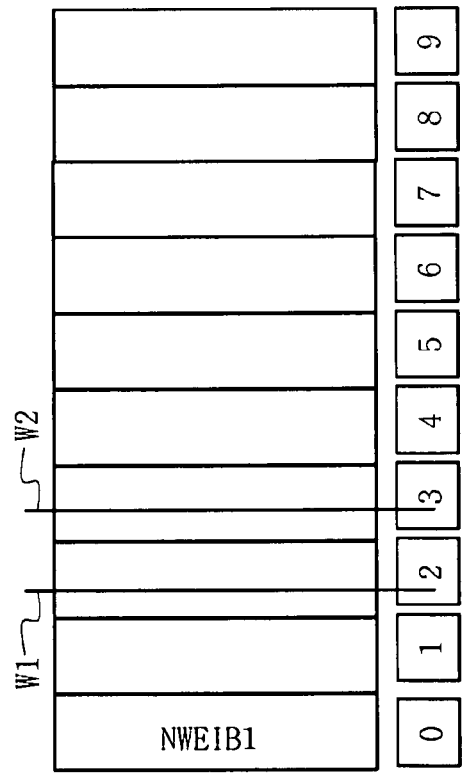

FIG. 7 is a circuit diagram illustrating a cell block row selection circuit within the row decoder 200 of FIG. 2 according to example embodiments. Referring to FIG. 7, the cell block row selection circuit may enable word lines of a plurality of main memory cell block and a plurality of sub-cell memory block at the same time in a multi-word line (MLW) test. The cell block row selection circuit may include a signal gating part 210, a first word line enable signal generator 220 and a second word line enable signal generator 230.

The signal gating part 210 may include a NOR gate NOR 1, a plurality of inverters IN1-IN4 and a plurality of NAND gates NA1-NA4. The signal gating part 210 may receive a main block selection signal MAIN_BLS, a sub-block selection signal SUB_BLS, a multi-word line test signal MWLSG, and may generate a PNWR signal, a PNWR_SUB signal, and a PDPXIP signal.

In the signal gating part 210, the NOR gate NOR1 may receive the main block selection signal MAIN_BLS and the sub-block selection signal SUB_BLS, and generate a NOR response. The inverter IN1 may invert an output of the NOR gate NOR1. The inverter IN2 may invert an output of the inverter IN1. Also, the inverter IN3 may invert an output of the inverter IN2. The NAND gate NA1 may receive an output of the inverter IN1 and the main block selection signal MAIN_BLS, and generate a NAND response. The NAND gate NA2 may receive the output of inverter IN1, and the sub-block selection signal SUB_BLS, and generate a NAND response. The NAND gate NA3 may receive the output of inverter IN1 and the multi-word line test signal MWLSG, and generate a NAND response. The inverter IN4 may invert an output of the NAND gate NA1 and generate the PNWR signal. The NAND gate NA4 may receive an output of the NAND gates NA2 and NA3, generate a NAND response, and output the PNWR_SUB-signal.

The first word line enable signal generator 220 may include a plurality of drivers to enable word lines for the plurality of main memory cell blocks. In this particular example embodiment, the plurality of drivers may be eight and the plurality of main memory cell blocks may be eight, for example. The number of drivers and main memory cell blocks may be different from eight, such as any number greater or equal to two.

The second word line enable signal generator 230 may include a plurality of drivers to enable word lines for the plurality of sub-cell memory blocks. In this particular example embodiment, the plurality of drivers may be two, for example. The number of drivers may be different from two, such as any number greater or equal to one.

Referring to FIG. 7, physical block coding may be added to the PNWR_SUB-path. When the multi-word line test signal MWLSG is a logic high, the PNWR signal and the PNWR_SUB signal may be enabled at the same time. When the multi-word line test signal MWLSG is a logic low, the cell block row selection circuit may operate in a normal state.

Thus, according to example embodiments, when performing the MWL test for an address of the main memory cell block within the physical block configured as the combination of a main memory cell block and a sub-cell memory block, a sub-cell memory block may undergo the MWL test as the same time as the main memory cell block. In addition, an address of the sub-cell memory block may be skipped when an address sweep is performed. Thus, according to example embodiments, the MWL test may enable more word lines. As result, the MWL test may be performed more effectively.

The MWL test range in an abnormal row address coding such as 320Cell/BL or 416Cell/BL coding can be extended by adding a logic method beyond the address "Don't Care" scheme to a row decoder of semiconductor memory device.

FIG. 12 illustrates a coding method for a 320Cell/BL memory cell block according to example embodiments. FIG. 12 illustrates 52 memory cell blocks. For instance, L0-L12, L13-L25, R0-R12 and R16-25 may comprise the 52 memory cell blocks. When dividing the memory cell blocks into four parts, each part may include 13 memory cell blocks. Physical 13 block may illustrate the memory cells corresponding to L0-L12. As stated in the background section, FIG. 8 illustrates coding for a conventional 256Cell/BL memory cell block, which shows a total of 64 memory cell blocks. Referring to FIG. 8, when dividing the memory cell blocks into four parts, each part may include 16 memory cell blocks, where L0-L15 illustrates 0-15 memory cell blocks.

Referring back to FIG. 12, when coding for a 320Cell/BL memory cell block, the coding for the 16 memory cell blocks in FIG. 8 may be disposed in the 13 memory cell blocks of FIG. 12. For instance, row addresses corresponding to the 13th~15th memory cell blocks may be divided and added to the 0-13 memory cell blocks of FIG. 12. In other words, the three memory cell blocks, 13th, 14th and 15th blocks, of the 16 memory cell blocks may be individually divided into 4 or 5 equal parts. The equal divided parts of the 13th, 14th and 15th cell blocks may be added to the 13 memory cell blocks of the physical 13 block. As a result, the physical 13 block becomes a logical 16 memory cell block, as shown on FIG. 12.

For example, the 13$^{th}$ memory cell block may be divided into four parts: 21, 23, 25 and 27. The four parts 21, 23, 25 and 27 may be individually disposed in No. 0 block (20), No. 1 block (22), No. 2 block (24), and No. 3 block (26), respectively. The 14$^{th}$ memory cell block may be divided into five parts: 29, 31, 33, 35 and 37. The divided five parts 29, 31, 33, 35 and 37 may be individually disposed in No. 4 block (28), No. 5 block (30), No. 6 block (32), No. 7 block (34), No. 8 block (36), respectively. The 15$^{th}$ memory cell block may be divided into four parts: 39, 41, 43 and 45. The divided four parts 39, 41, 43 and 45 may be individually disposed in No. 9 block (38), No. 10 block (40), No. 11 block (42) and No. 12 block (44), respectively.

The address coding sequence described above is not limited to the arrangement described above, but may also include other address coding sequences within the example embodiments. As a result, a chip size may be reduced because the number of logic gates of a row decoder in a cell block coding is reduced.

Within the logical 16 blocks shown in FIG. 12, a first main block 20 may be coded as 0000 corresponding to RA11, RA10, RA9 and RA8. A first sub-block 21 may be coded as 1(RA11) 1(RA10) 0(RA9) 1(RA8) (RA7:00) (RA6:00) (RA5:01) corresponding to RA11-RA5. (RA7:00) (RA6:00) (RA5:01) are shown with respect to reference number 50. A second sub-block 23 may be coded as RA7:00, RA6:11, RA5:01, as shown with respect to reference number 51.

Figure 13:
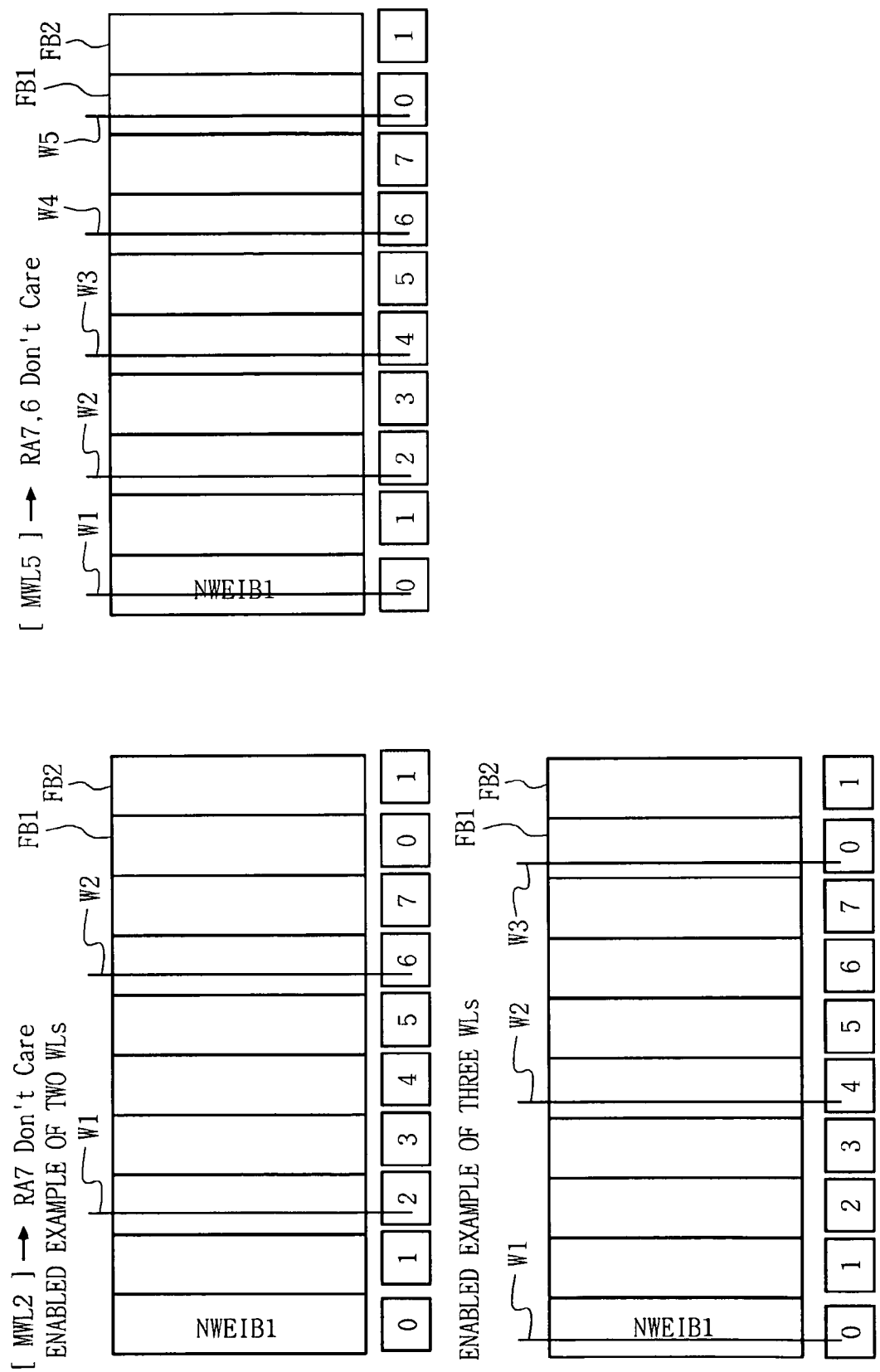

FIGS. 13 and 14 illustrate a MWL test through the cell block coding of FIG. 12 according to example embodiments. In regards to the 320Cell/BL memory cell block, the number of word line enable signals NWEIB1 lines may be 10 within one memory cell block. For instance, eight word line enable signals NWEIB1 that correspond to the main block and two word line enable signals NWEIB1 that correspond to the sub-cell memory block (as in the case of the 256Cell/BL memory cell block) may be combined, thus becoming a total of ten. As a result, the MWL test may be performed on the main block and the sub-block at the same time.

Referring to FIG. 13 and MWL2, when RA7 becomes "Don't Care", one word line per four word line enable signals NWEIB1 may be enabled. In other word, two word lines W1 and W2 within the physical block may be enabled. In addition, referring to the lower left part of FIG. 13, three word lines W1, W2 and W3 may be enabled. As a result, two word lines may be enabled at the same time and/or three word lines may be enabled at the same time when RA7 becomes Don't Care.

Referring to MWL5, when the row address RA7, RA6 becomes Don't Care (MWL5), one word line per two word line enable signals NWEIB1 may be enabled. As a result, within the memory cell block, five word lines W1-W5 may be enabled.

Referring to FIG. 14 and MWL10, when RA7, RA6 and RA5 become Don't Care, one word line per word line enable signal NWEIB1 may be enabled, and a total of ten word lines W1-W10 per memory cell block may be enabled. Referring to MWL20, when RA7, 6, 5 and 4 become Don't Care, two word lines per word line enable signal NWEIB1 may be enabled and a total of twenty word lines W1-W20 per memory cell block may be enabled at the same time.

The coding method of FIG. 12 will be further explained with reference to FIG. 7. For example, in the example embodiments of a 416Cell/BL memory cell block, the multi-word line test information and physical block coding may be individually added to two PNWR_SUB-paths. A word line of the sub-cell memory block may be enabled through a linking with the main block selection signal MAIN_BLS in the MWL test.

Furthermore, to code a 320Cell/BL memory cell block in a division layout scheme illustrated in FIG. 12, NAND gate NA3 of gating block 210 shown in FIG. 7 may be eliminated, and an inverter may be used instead of the NAND gate NA4. The main memory cell block and sub-cell memory block may be enabled individually and separately. For instance, the main block selection signal MAIN_BLS and the sub-block selection signal SUB_BLS may be combined, thus providing an entire physical block coding. When the main block selection signal MAIN_BLS is applied, the PDPXIP and PNWR signals may be enabled in the same method as the 256Cell/BL memory cell block. The DRA 234 and 567 signals may be combined with the PDPXIP and PNWR signals, thus enabling the word line enable signal NWEIB<i>. When the sub-block selection signals SUB_BLS is applied, the PDPXIP and PNWR_SUB signals may be enabled, and the word line enable signal NWEIB<j> may be enabled similarly to the main memory cell block. 416Cell/BL memory cell bock may be configured to additionally have respective one SUB_BLS path and PNWR_SUB path.

As a result, referring to FIG. 7, multi-word line test information and physical block coding may be added into the PNWR_SUB-path so as to enable the main memory cell block and the sub-cell memory block at the same time.

When performing the multi-word line test with reference to FIGS. 13-14 in the block coding like in FIG. 12, a portion corresponding to the sub-block selection signal SUB_BLS must be skipped when an address sweep is performed. For example, when an address corresponding to the sub-block selection signals SUB_BLS is not skipped in the address sweep, the MWL test may be performed when the main block selection signal MAIN_BLS is selected and the sub-block selection signals SUB_BLS is selected. Therefore, test time may increase and an over-stress may be caused. To the contrary, when the sub-cell memory block address is skipped, a testing time may be reduced.

The number of cells illustrated in the example embodiments is for explanatory purposes only, where the number of cells may be added or reduced without deviating from the example embodiments. In addition, although DRAM has been described above, other types of memory devices may be within the example embodiments, such as SRAM or PRAM, for example.

While the example embodiments have been shown and described with reference to FIGS. 1-7 and 12-13, it will be understood by one of ordinary skill in the art that various changes in form and details may be made therein without departing from the spirit and scope of the example embodiments as defined by the following claims.

What is claimed is:

1. An address coding method to test a semiconductor memory device, the semiconductor memory device including a plurality of memory cell blocks, each memory cell block includes memory cells coupled to a bit line, the method comprising:
   coding row addresses of the memory cell block by dividing one or more row addresses corresponding to cell blocks of the memory cell block to create sub-cell blocks and adding the sub-cell blocks into the main cell blocks to create a logical memory block, wherein word lines of the main cell blocks and sub-cell blocks are enabled at the same time.

2. The method of claim 1, wherein a number of the memory cells coupled to the bit line is not $2^n$, n being an integer greater or equal to two.

3. The method of claim 2, wherein the number of memory cells coupled to the bit line is 320.

4. The method of claim 2, wherein the number of memory cells coupled to the bit line is 416.

5. The method of claim 1, wherein the number of cell blocks is 52 and the number of cell blocks is divided into four memory cell block groups, each memory cell block group includes 13 cell blocks.

6. The method of claim 5, wherein a number of cell blocks of the logical memory block is greater than the number of cell blocks within each memory cell block group.

7. A semiconductor memory device including a cell block row selection circuit for enabling word lines of a memory cell block in a multi-word line test, the memory cell block includes main cell blocks and sub-cell blocks, the cell block row selection circuit comprising:
   a signaling gating part configured to receive a main block selection signal, a sub-block selection signal, and a multi-word line test signal and generate sub-path signals;
   a first word line enable signal generator configured to generate word line enable signals to enable word lines for the main cell blocks;
   a second word line enable signal generator configured to generate word line enable signals to enable word lines for the sub-cell blocks, the main cell blocks and the sub-cell blocks being enabled at the same time by coding row addresses of the memory cell block by dividing one or more row addresses corresponding to cell blocks of the memory cell block to create the sub-cell blocks and adding the sub-cell blocks into the main cell blocks to create a logical memory block.

8. The semiconductor memory device of claim 7, wherein the main cell blocks and the sub-cell blocks are enabled at the same time in response to the main block selection signal, the sub-block selection signal, and the multi-word line test signal.

9. The semiconductor memory device of claim 8, wherein a word line of the sub-cell blocks is enabled through a linking to the main block selection signal.

10. The semiconductor memory device of claim 7, wherein each memory cell block includes memory cells coupled to a bit line and a number of the memory cells coupled to the bit line is not $2^n$, n being an integer greater or equal to two.

11. The semiconductor memory device of claim 10, wherein the number of memory cells coupled to the bit line is 320.

12. The semiconductor memory device of claim 10, wherein the number of memory cells coupled to the bit line is 416.

13. The semiconductor memory device of claim 7, wherein multi-word line test information and block coding is added into the sub-path signals.

14. The semiconductor memory device of claim 7, wherein the number of cell blocks is 52 and the number of cell blocks is divided into four memory cell block groups, each memory cell block group includes 13 cell blocks.

15. The semiconductor memory device of claim 14, wherein a number of cell blocks of the logical memory block is greater than the number of cell blocks within each memory cell block group.

16. The semiconductor memory device of claim 7, wherein when a row address of the main cell blocks is swept once in the multi-word line test, a word-line corresponding to the sub-blocks is enabled without specifically applying an address of the sub-block.

17. The semiconductor memory device of claim 7, wherein the first and second word line enable signal generators includes a plurality of drivers.

* * * * *